(12) United States Patent
Nishimoto et al.

(10) Patent No.: US 9,941,235 B2
(45) Date of Patent: Apr. 10, 2018

(54) POWER MODULE SUBSTRATE WITH AG UNDERLAYER AND POWER MODULE

(71) Applicant: MITSUBISHI MATERIALS CORPORATION, Tokyo (JP)

(72) Inventors: Shuji Nishimoto, Okegawa (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/509,492

(22) PCT Filed: Sep. 28, 2015

(86) PCT No.: PCT/JP2015/077290
§ 371 (c)(1),
(2) Date: Mar. 8, 2017

(87) PCT Pub. No.: WO2016/052392
PCT Pub. Date: Apr. 7, 2016

(65) Prior Publication Data
US 2017/0294399 A1 Oct. 12, 2017

(30) Foreign Application Priority Data

Sep. 30, 2014 (JP) .................................. 2014-200878
Sep. 18, 2015 (JP) .................................. 2015-185296

(51) Int. Cl.
*H01L 21/00* (2006.01)
*H01L 23/12* (2006.01)
(Continued)

(52) U.S. Cl.
CPC .............. *H01L 24/32* (2013.01); *H01L 23/12* (2013.01); *H01L 23/36* (2013.01); *H01L 23/40* (2013.01);
(Continued)

(58) Field of Classification Search
CPC ......... H01L 24/32; H01L 23/12; H01L 23/36; H01L 23/40; H01L 25/07; H01L 25/18;
(Continued)

(56) References Cited

U.S. PATENT DOCUMENTS 9,401,340 B2 * 7/2016 Nishimoto ............. H01L 24/32
9,693,449 B2 * 6/2017 Nishimoto ........... H05K 1/0271
(Continued)

FOREIGN PATENT DOCUMENTS

JP 2004-172378 A 6/2004
JP 2006-202938 A 8/2006
(Continued)

OTHER PUBLICATIONS

International Search Report dated Nov. 24, 2015, issued for PCT/JP2015/077290 and English translation thereof.

*Primary Examiner* — David Zarneke
(74) *Attorney, Agent, or Firm* — Locke Lord LLP

(57) ABSTRACT

A power module substrate with a Ag underlayer of the invention includes: a circuit layer that is formed on one surface of an insulating layer; and a Ag underlayer that is formed on the circuit layer, in which the Ag underlayer is composed of a glass layer that is formed on the circuit layer side and a Ag layer that is formed by lamination on the glass layer, and regarding the Ag underlayer, in a Raman spectrum obtained by a Raman spectroscopy with incident light made incident from a surface of the Ag layer on a side opposite to the glass layer, when a maximum value of intensity in a wavenumber range of 3,000 cm$^{-1}$ to 4,000 cm$^{-1}$ indicated by $I_A$, and a maximum value of intensity in a wavenumber range of 450 cm$^{-1}$ to 550 cm$^{-1}$ is indicated by $I_B$, $I_A/I_B$ is 1.1 or greater.

16 Claims, 7 Drawing Sheets

(51) Int. Cl.
*H01L 23/36* (2006.01)
*H01L 23/40* (2006.01)
*H01L 25/07* (2006.01)
*H01L 25/18* (2006.01)
*H05K 3/24* (2006.01)
*H05K 3/26* (2006.01)
*H01L 23/00* (2006.01)

(52) U.S. Cl.
CPC .............. *H01L 25/07* (2013.01); *H01L 25/18* (2013.01); *H05K 3/24* (2013.01); *H05K 3/26* (2013.01); *H01L 2224/32225* (2013.01); *H01L 2924/01047* (2013.01); *H01L 2924/141* (2013.01)

(58) Field of Classification Search
CPC . H01L 2224/32225; H01L 2924/01047; H01L 2924/141; H05K 3/24; H05K 3/26
See application file for complete search history.

(56) References Cited

U.S. PATENT DOCUMENTS

| | | | |
|---|---|---|---|
| 2011/0070695 A1* | 3/2011 | Bayerer | H01L 24/49 438/107 |
| 2011/0132436 A1* | 6/2011 | Nakata | H01L 31/035281 136/251 |
| 2012/0018759 A1 | 1/2012 | Ohta | |
| 2016/0293562 A1* | 10/2016 | Nishimoto | H01L 24/29 |

FOREIGN PATENT DOCUMENTS

| | | |
|---|---|---|
| JP | 2008-208442 A | 9/2008 |
| JP | 2009-267374 A | 11/2009 |
| JP | 2010-287869 A | 12/2010 |
| JP | 2012-049512 A | 3/2012 |
| JP | 2012-109315 A | 6/2012 |
| JP | 2013-012706 A | 1/2013 |
| JP | 2014-179564 A | 9/2014 |

* cited by examiner

FIG. 8
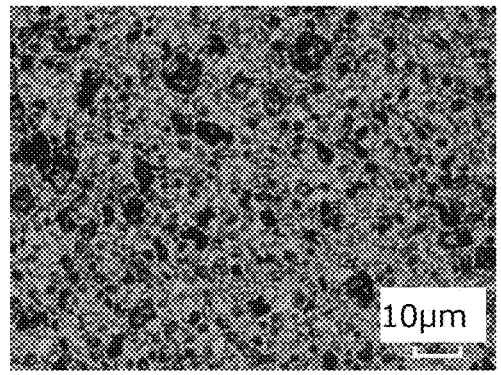
(a)
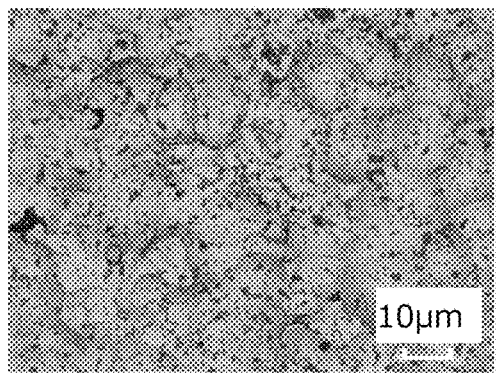
(b)
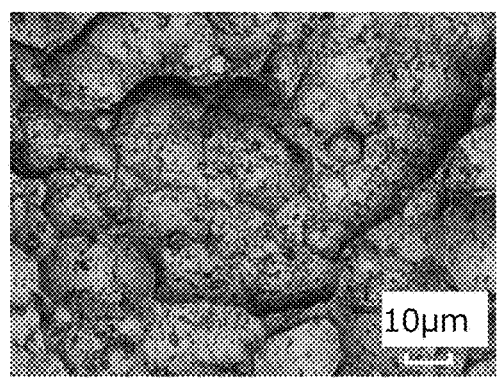
(c)

POWER MODULE SUBSTRATE WITH AG UNDERLAYER AND POWER MODULE

TECHNICAL FIELD

The present invention relates to a power module substrate with a Ag underlayer in which a circuit layer is formed on one surface of an insulating layer, and a power module using the substrate.

Priority is claimed on Japanese Patent Application No. 2014-200878, filed on Sep. 30, 2014, and Japanese Patent Application No. 2015-185296, filed on Sep. 18, 2015, the contents of which are incorporated herein by reference.

BACKGROUND ART

Semiconductor devices such as LEDs and power modules have a structure in which a semiconductor element is bonded on a circuit layer made of a conductive material.

Power semiconductor elements for high-power control that are used to control wind power generation, electric cars, hybrid-power cars, and the like have a high calorific value. Therefore, for example, a power module substrate provided with an insulating layer formed of a ceramic substrate such as aluminum nitride (AlN) or alumina ($Al_2O_3$) and a circuit layer formed by providing a metal having excellent conductive properties on one surface of the insulating layer has been widely used as a substrate on which the power semiconductor element is mounted.

On the circuit layer of such a power module substrate, a semiconductor element as a power element is mounted via a solder material (for example, see PTL 1).

As a constituent metal of the circuit layer, aluminum or an alloy thereof, or copper or an alloy thereof is generally used.

Here, in a circuit layer made of aluminum or an alloy thereof, a natural oxide film of aluminum is formed on a surface, and thus it is difficult to satisfactorily perform bonding to a semiconductor element using a solder material.

In a circuit layer made of copper or an alloy thereof, a melted solder material and the copper reacts with each other. The components of the solder material enter the circuit layer and there is a concern that characteristics of the circuit layer may deteriorate.

Accordingly, as shown in PTL 1, a semiconductor element has been bonded using a solder material after formation of a Ni plating film on a surface of a circuit layer.

For example, PTL 2 suggests a technology for bonding a semiconductor element using a Ag nano paste as a bonding method without the use of a solder material.

PTLs 3 and 4 suggest a technology for bonding a semiconductor element using an oxide paste containing metal oxide particles and a reducing agent composed of organic matter.

However, in a case where a semiconductor element is bonded using a Ag nano paste without the use of a solder material as disclosed in PTL 2, a bonding layer composed of the Ag nano paste is made thinner than the solder material, and thus a stress under the load of a thermal cycle easily acts on the semiconductor element, and there is a concern that the semiconductor element itself may be broken.

In addition, also in a case where a semiconductor element is bonded using a metal oxide and a reducing agent as disclosed in PTLs 3 and 4, a thin sintered layer of an oxide paste is formed, and thus a stress under the load of a thermal cycle easily acts on the semiconductor element, and there is a concern that the performance of the power module may deteriorate.

Accordingly, for example, PTLs 5 to 7 disclose a technology for bonding, after formation of a Ag underlayer on a circuit layer made of aluminum or copper using a glass-containing Ag paste, a semiconductor element to the circuit layer via a solder material or a Ag paste. In this technology, by applying and sintering the glass-containing Ag paste on the surface of the circuit layer made of aluminum or copper, the oxide film formed on the surface of the circuit layer is reacted with the glass and removed to form the Ag underlayer, and on the circuit layer on which the Ag underlayer is formed, a semiconductor element is bonded via a solder material.

Here, the Ag underlayer is provided with a glass layer formed by the reaction of the glass with the oxide film of the circuit layer and a Ag layer formed on the glass layer. Conductive particles are dispersed in the glass layer, and conduction of the glass layer is secured by the conductive particles.

CITATION LIST

Patent Literatures

[PTL 1] Japanese Unexamined Patent Application, First Publication No.
[PTL 2] Japanese Unexamined Patent Application, First Publication No. 2008-208442
[PTL 3] Japanese Unexamined Patent Application, First Publication No. 2009-267374
[PTL 4] Japanese Unexamined Patent Application, First Publication No. 2006-202938
[PTL 5] Japanese Unexamined Patent Application, First Publication No. 2010-287869
[PTL 6] Japanese Unexamined Patent Application, First Publication No. 2012-109315
[PTL 7] Japanese Unexamined Patent Application, First Publication No. 2013-012706

DISCLOSURE OF INVENTION

Technical Problem

In order to improve bonding reliability between the circuit layer and the Ag underlayer, it is effective to increase the content of the glass in the glass-containing Ag paste.

However, in a case where the glass content in the glass-containing Ag paste is increased, the thickness of the glass layer in the Ag underlayer is increased. The glass layer has higher electrical resistance than the Ag layer and the like even in a case where the conductive particles are dispersed therein. Therefore, the electrical resistance value of the Ag underlayer tends to increase with an increase of the thickness of the glass layer, and it was difficult to keep a balance between the bonding reliability and the electrical resistance value. In a case where the electrical resistance value of the Ag underlayer is high as described above, there was a concern that conductive properties between the circuit layer and an electronic component such as a semiconductor element might not be secured when the circuit layer on which the Ag underlayer has been formed was bonded to the semiconductor element via a solder material or the like.

The invention is contrived in view of the above-described circumstances, and an object thereof is to provide a power module substrate with a Ag underlayer in which, even in a case where a Ag underlayer having a glass layer and a Ag layer is formed on a circuit layer, the Ag underlayer has a sufficiently reduced electrical resistance value, and a power module.

Solution to Problem

In order to solve the problem and achieve the object, a power module substrate with a Ag underlayer according to an embodiment of the invention is a power module substrate with a Ag underlayer including: a circuit layer that is formed on one surface of an insulating layer; and a Ag underlayer that is formed on the circuit layer, in which the Ag underlayer is composed of a glass layer that is formed on the circuit layer side and a Ag layer that is formed by lamination on the glass layer, and regarding the Ag underlayer, in a Raman spectrum obtained by a Raman spectroscopy with incident light made incident from a surface of the Ag layer on a side opposite to the glass layer, when a maximum value of intensity in a wavenumber range of 3,000 $cm^{-1}$ to 4,000 $cm^{-1}$ is indicated by $I_A$, and a maximum value of intensity in a wavenumber range of 450 $cm^{-1}$ to 550 $cm^{-1}$ is indicated by $I_B$, $I_A/I_B$ is 1.1 or greater.

In the Ag underlayer in which characteristics of the Raman spectrum obtained by the Raman spectroscopy are in the above-described range, mobility of Ag ions in the Ag underlayer is increased, and the electrical resistance value of the Ag underlayer can be significantly reduced even in a case where the Ag underlayer has the glass layer. Accordingly, it is possible to provide a power module substrate with a Ag underlayer in which conductive properties of the Ag underlayer are increased.

An electrical resistance value in a thickness direction of the Ag underlayer is 10 mΩ or less.

In this case, since the electrical resistance value in the thickness direction of the Ag underlayer is 10 mΩ or less, conductive properties of the Ag underlayer are secured, and by mounting a semiconductor element on the Ag underlayer, it is possible to obtain a power module of which the conduction loss is small.

The Ag underlayer is a sintered body of a glass-containing Ag paste.

Accordingly, the Ag underlayer can be composed of a glass layer and a Ag layer that is formed by lamination on the glass layer, and conductive properties of the glass layer can be increased by the Ag layer.

The surface of the Ag underlayer on a side opposite to the glass layer is a surface subjected to a conductive property improving treatment.

Accordingly, conductive properties of the Ag underlayer are increased, and it is possible to realize a power module substrate with a Ag underlayer in which the electrical resistance value is significantly reduced.

A power module according to an embodiment of the invention includes: the power module substrate with a Ag underlayer according to any one of the paragraphs; and a semiconductor element, and the semiconductor element is bonded to the Ag underlayer via a bonding layer.

According to the power module having this configuration, the electrical resistance value of the Ag underlayer can be significantly reduced even in a case where the Ag underlayer has the glass layer. Therefore, it is possible to provide a power module with excellent bonding reliability in which a circuit layer and a semiconductor element are securely electrically bonded to each other.

Advantageous Effects of Invention

According to the invention, it is possible to provide a power module substrate with a Ag underlayer in which, even in a case where a Ag underlayer having a glass layer and a Ag layer is formed on a circuit layer, the electrical resistance value of the Ag underlayer can be sufficiently reduced, and a power module.

BRIEF DESCRIPTION OF DRAWINGS

FIG. 8 shows photographs obtained by observing an upper surface of the Ag underlayer subjected to blasting that is an example of a conductive property improving treatment in examples.

BEST MODE FOR CARRYING OUT THE INVENTION

Hereinafter, embodiments of the invention will be described with reference to the accompanying drawings.

Figure 1:
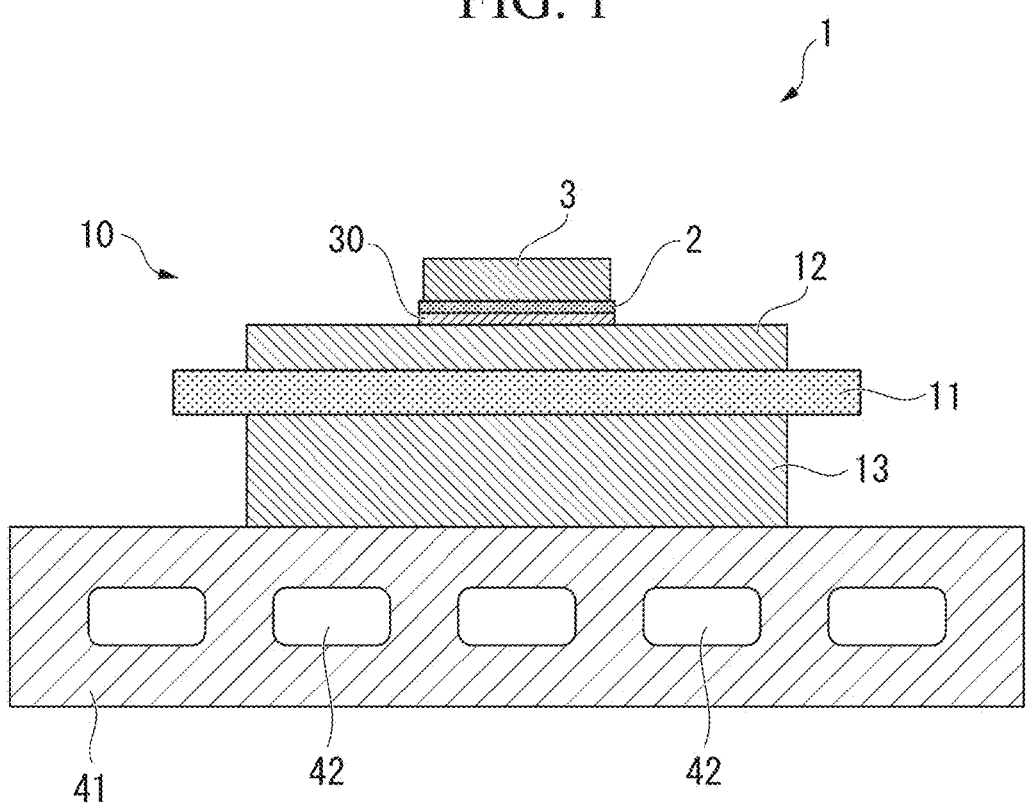
FIG. 1 is a schematic illustration of a power module of an embodiment of the invention.

FIG. 1 illustrates a power module 1 of an embodiment of the invention. This power module 1 is provided with a power module substrate 10 with a Ag underlayer, a semiconductor element 3 that is bonded to one surface (upper surface in FIG. 1) of the power module substrate 10 with a Ag underlayer via a bonding layer 2, and a heat sink 41 that is disposed on the other surface (lower side in FIG. 1) of the power module substrate 10 with a Ag underlayer. A power semiconductor element such as an IGBT or a light-emitting element such as a LED can be used as the semiconductor element 3.

Figure 2:
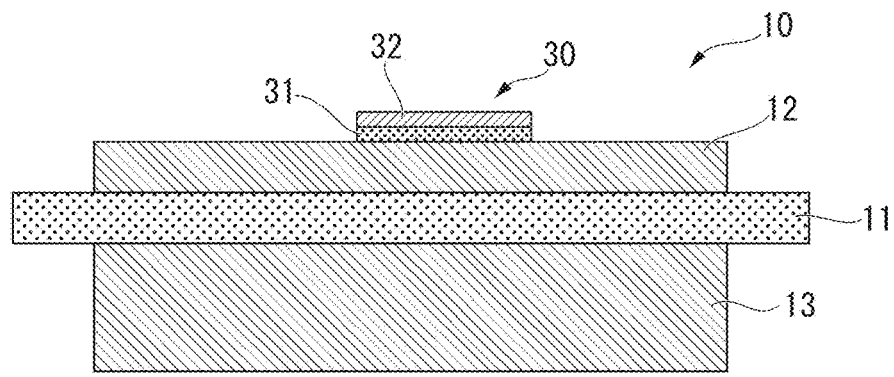
FIG. 2 is a schematic illustration of a power module substrate with a Ag underlayer of an embodiment of the invention.

As illustrated in FIG. 2, the power module substrate 10 with a Ag underlayer is provided with a ceramic substrate 11 constituting an insulating layer, a circuit layer 12 disposed on one surface (upper surface in FIG. 2) of the ceramic substrate 11, a metal layer 13 disposed on the other surface (lower surface in FIG. 2) of the ceramic substrate 11, and a Ag underlayer 30 formed on one surface of the circuit layer 12.

The ceramic substrate 11 prevents electrical connection between the circuit layer 12 and the metal layer 13, and is made of, for example, AlN (aluminum nitride), $Si_3N_4$ (silicon nitride), $Al_2O_3$ (alumina), or the like having high insulating properties. In this embodiment, the ceramic substrate is made of AlN (aluminum nitride) having excellent heat dissipation properties. The thickness of the ceramic substrate 11 is set in a range of 0.2 to 1.5 mm, and in this embodiment, the thickness is set to 0.635 mm.

Figure 5:
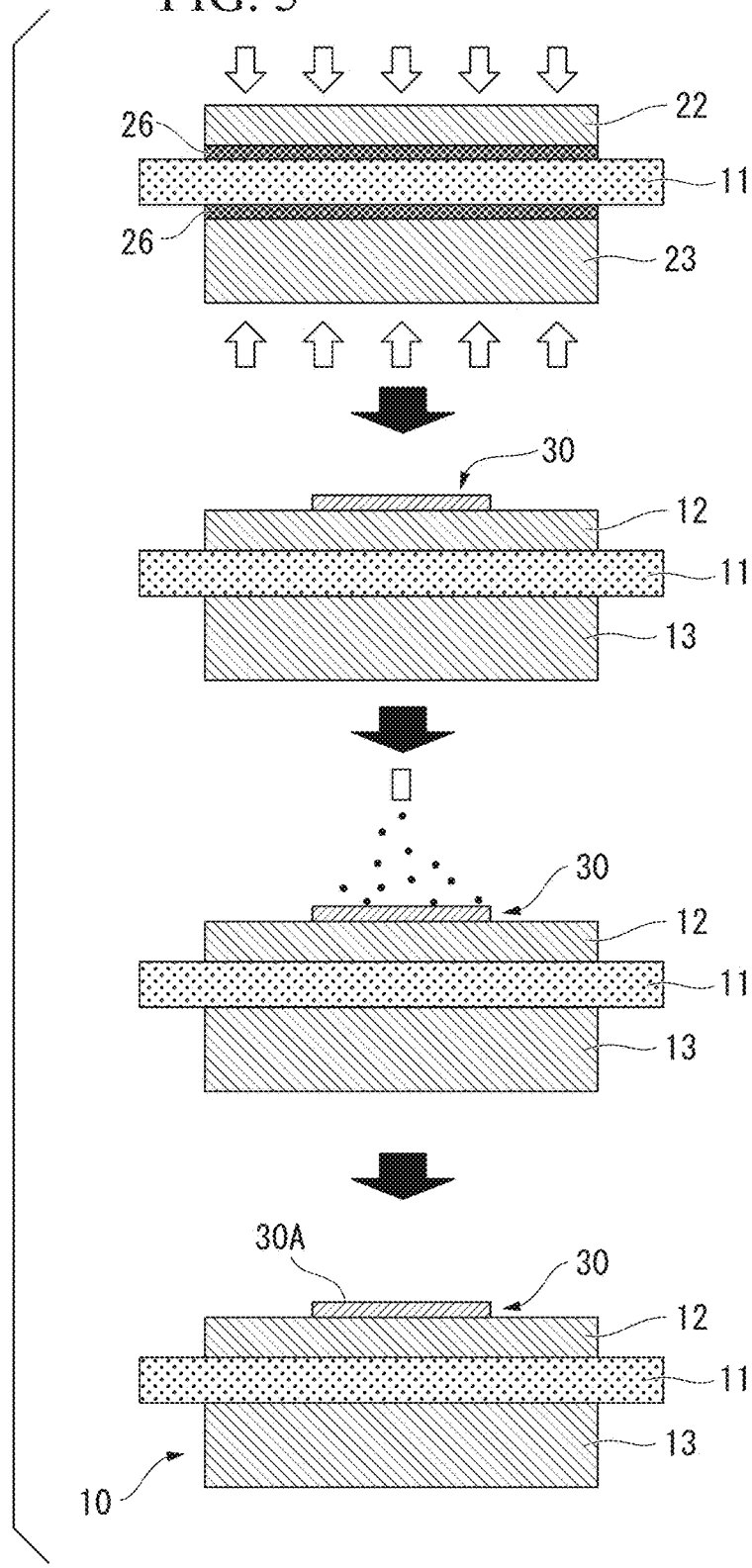
FIG. 5 is a schematic illustration illustrating an example of the method of manufacturing a power module substrate with a Ag underlayer.

As illustrated in FIG. 5, the circuit layer 12 is formed by bonding a conductive metal plate 22 to one surface of the ceramic substrate 11. In this embodiment, the circuit layer 12 is formed by bonding an aluminum plate composed of a rolled plate of aluminum (so-called 4N aluminum) with a purity of at least 99.99 mass % to the ceramic substrate 11. This circuit layer 12 has a circuit pattern formed thereon, and one surface thereof (upper surface in FIG. 1) serves as a mounting surface on which the semiconductor element 3 is mounted. Here, the thickness of the circuit layer 12 (metal plate 22) is set in a range of 0.2 mm to 3.0 mm, and in this embodiment, the thickness is set to 0.6 mm.

As illustrated in FIG. 5, the metal layer 13 is formed by bonding a metal plate 23 to the other surface of the ceramic substrate 11. In this embodiment, the metal layer 13 is formed by bonding an aluminum plate composed of a rolled plate of aluminum (so-called 4N aluminum) with a purity of at least 99.99 mass % to the ceramic substrate 11. Here, the thickness of the metal layer 13 (metal plate 23) is set in a range of 0.2 mm to 3.0 mm, and in this embodiment, the thickness is set to 1.6 mm.

Figure 3:
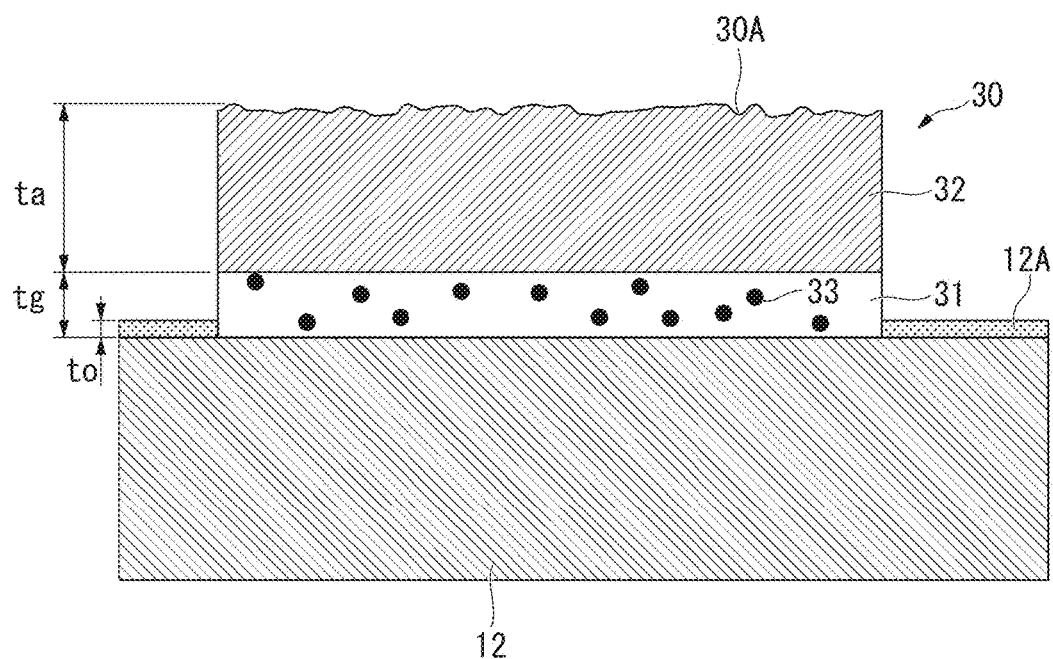
FIG. 3 is an enlarged cross-sectional view illustrating a main part of a bonding part of a Ag underlayer to a circuit layer.

The Ag underlayer 30 is a sintered body of a glass-containing Ag paste containing a glass component. As illustrated in FIGS. 2 and 3, this Ag underlayer 30 is provided with a glass layer 31 formed on a side of the circuit layer 12 and a Ag layer 32 formed on the glass layer 31 before a state in which the semiconductor element 3 is bonded.

In the glass layer 31, fine conductive particles 33 of approximately several nanometers in particle diameter are dispersed. The conductive particles 33 are composed of crystalline particles containing at least one of Ag or Al. The conductive particles 33 in the glass layer 31 are observed using, for example, a transmission electron microscope (TEM). The conductive particles 33 are assumed to be precipitated in the glass layer 31 during sintering.

In addition, in the Ag layer 32, fine glass particles (omitted in the drawing) of approximately several nanometers in particle diameter are dispersed.

The glass layer 31 and the Ag layer 32 are thought to be formed by moving, to the vicinity of an interface with the circuit layer 12, the glass softened and having fluidity during sintering of the glass-containing Ag paste by Ag particle growth.

In this embodiment, since the circuit layer 12 is made of aluminum with a purity of at least 99.99 mass %, an aluminum oxide film 12A naturally formed in the atmosphere is formed on the surface of the circuit layer 12. Here, this aluminum oxide film 12A is removed in a part where the above-described Ag underlayer 30 is formed, and the Ag underlayer 30 is directly formed on the circuit layer 12. That is, as illustrated in FIG. 3, the aluminum constituting the circuit layer 12 and the glass layer 31 are directly bonded to each other. The aluminum oxide film 12A is removed by reaction with the glass in the glass-containing Ag paste. The oxide film is dissolved as an aluminum oxide in the glass. A part thereof is precipitated as multiple oxide crystals with components of the glass such as $Bi_2O_3$ and ZnO.

In this embodiment, as illustrated in FIG. 3, a thickness to of the aluminum oxide film 12A naturally formed on the circuit layer 12 is in a range of 4 nm≤to≤6 nm. In addition, a thickness tg of the glass layer 31 is in a range of 0.01 μm≤tg≤5 μm, a thickness ta of the Ag layer 32 before blasting to be described later is in a range of 1 μm≤ta≤100 μm, and an overall thickness tl of the Ag underlayer 30 is in a range of 1.01 μm≤tl≤105 μm.

Regarding the Ag underlayer 30 having the above-described configuration, in a Raman spectrum obtained by a Raman spectroscopy with incident light (light source light) made incident from a surface 30A of the Ag layer 32 on a side opposite to the glass layer 31 using a Raman spectroscopic measuring apparatus, when a maximum value of intensity in a wavenumber range of 3,000 $cm^{-1}$ to 4,000 $cm^{-1}$ is indicated by $I_A$, and a maximum value of intensity in a wavenumber range of 450 $cm^{-1}$ to 550 $cm^{-1}$ is indicated by $I_B$, $I_A/I_B$ is 1.1 or greater. $I_A/I_B$ is preferably 1.2 or greater, and more preferably 1.5 or greater. The greater $I_A/I_B$, the better, but extremely increasing $I_A/I_B$ leads to an increase in cost. Therefore, $I_A/I_B$ may be preferably 1.9 or less.

In a case where, for example, incident light of single wavelength is made incident to the Ag underlayer 30, the light collides with the molecules constituting the Ag underlayer 30, and part of the light is scattered. Most of components of the scattered light is Rayleigh scattered light with the same wavenumber as the incident light, but part thereof is Raman scattered light that is light in a wavenumber range different from that of the incident light. The energy gap between the incident light and the Raman scattered light reflects a molecular structure of the Ag underlayer 30.

Since a Ag single body constituting the Ag underlayer 30 does not show a specific wavenumber peak by Raman spectroscopy, the specific wavenumber peak of the Ag underlayer 30 generated by Raman spectroscopy is thought to be generated by the oxide contained in the Ag underlayer 30. The Raman spectrum changes in accordance with the amount of Ag contained in the Ag underlayer 30. For example, the Raman spectrum changes and a wavenumber peak is generated in a wavenumber range of 3,000 $cm^{-1}$ to 4,000 $cm^{-1}$ around a wavenumber of 3,500 $cm^{-1}$ as a center. With the wavenumber peak in such a wavenumber range, Ag is ionized and changes into $Ag^+$. Therefore, the wavenumber peak in a wavenumber range of 3,000 $cm^{-1}$ to 4,000 $cm^{-1}$ around a wavenumber of 3,500 $cm^{-1}$ as a center is related to mobility of ions as a carrier, and shows that the higher the intensity of the wavenumber peak, the higher the conductive properties of the Ag underlayer 30.

Figure 9:
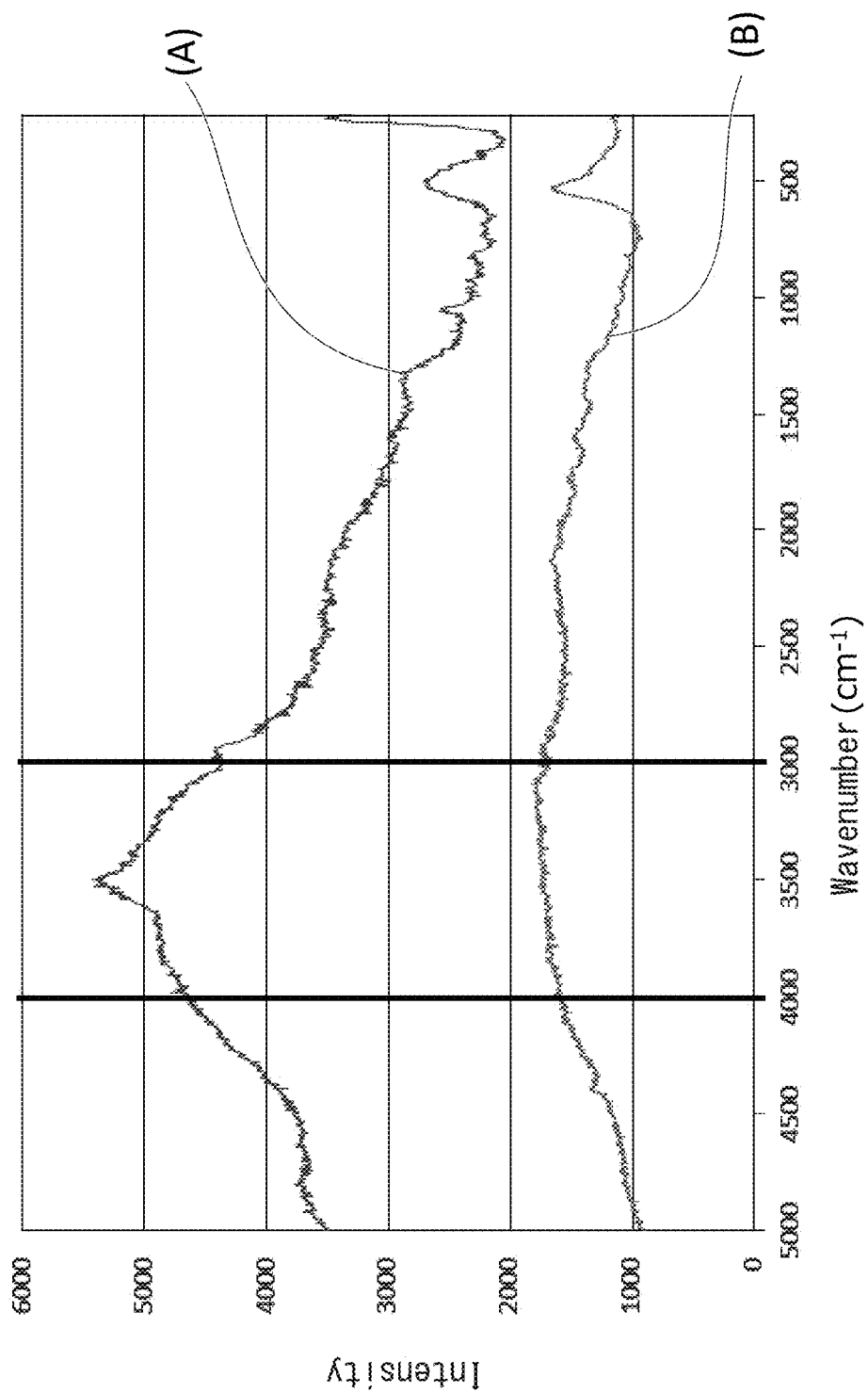
FIG. 9 is a graph illustrating a Raman spectrum of the Ag underlayer obtained by Raman spectroscopy.

As an example, FIG. 9 illustrates an example of the measurement of a Raman spectrum obtained by a Raman spectroscopy with incident light made incident from the surface 30A of the Ag layer 32 using the Ag underlayer 30 containing 5 wt % of the glass component. According to the example of the measurement result illustrated in FIG. 9, a peak around a wavenumber of 3,500 $cm^{-1}$ as a center is observed. That is, in a case where $I_A/I_B$ is 1.1 or greater when a maximum value of intensity in a wavenumber range of 3,000 $cm^{-1}$ to 4,000 $cm^{-1}$ is indicated by $I_A$, and a maximum value of intensity in a wavenumber range of 450 $cm^{-1}$ to 550 $cm^{-1}$ is indicated by $I_B$, Ag constituting the Ag underlayer 30 is ionized and changes into $Ag^+$, and it is shown that the conductive properties of the Ag underlayer 30 are increased. The spectrum of (A) in FIG. 9 shows an example for a case where $I_A/I_B$ is 1.1 or greater, and the spectrum of (B) shows an example for a case where $I_A/I_B$ is less than 1.1.

In this embodiment, the surface (upper surface in FIG. 3) 30A of the Ag underlayer 30 is a surface subjected to a conductive property improving treatment. That is, a surface of the Ag layer 32 on a side opposite to the glass layer 31 is subjected to a conductive property improving treatment to promote Ag ionization and consequently change Ag into $Ag^+$, whereby the conductive properties of the Ag underlayer 30 are improved. By performing the conductive property improving treatment, the above-described $I_A/I_B$ of the Raman spectrum obtained by the Raman spectroscopy can be adjusted to 1.1 or greater.

Blasting is a specific example of the conductive property improving treatment. That is, in this embodiment, the surface subjected to the conductive property improving treatment is the blast surface 30A. This blast surface 30A is formed by collision of blast abrasive particles with the Ag layer 32, and is provided with irregularities having a shape according to the blast abrasive particles.

A surface resistivity Ra of the blast surface 30A may be 0.35 μm to 1.50 μm. In a case where the surface resistivity Ra is less than 0.35 μm, there is a concern that the blasting may not be sufficiently performed and the electrical resistance may not be reduced. In a case where the surface resistivity Ra is greater than 1.50 μm, the blast surface 30A is excessively roughened, and thus there is a concern that in a case where a semiconductor element is bonded by solder or the like, a void may be generated and thermal resistance may be increased. The surface resistivity Ra is more preferably 0.40 μm to 1.0 μm, but is not limited thereto.

By the blasting for forming the blast surface 30A, a pressure is applied to the Ag layer 32 and pores in the Ag layer 32 are crushed. In addition, a location where part of the Ag layer 32 is brought into direct contact with the circuit layer 12 is formed.

When blasting is performed on a surface of the Ag layer 32 on a side opposite to the glass layer 31 as an example of the conductive property improving treatment, in a case where, for example, $Bi_2O_3$—ZnO—$B_2O_3$-based glass is used as the glass component of the Ag underlayer 30, a crosslinked structure of B—O—B changes into a non-crosslinked structure of B—O, and Ag changes into $Ag^+$. By virtue of such a conductive property improving treatment such as blasting, an electrical resistance value P in the thickness direction of the Ag underlayer 30 can be adjusted to, for example, 10 mΩ or less. The electrical resistance value P in the thickness direction of the Ag underlayer 30 is preferably 5 mΩ or less, and more preferably 1 mΩ or less, but is not limited thereto. The smaller the electrical resistance value P in the thickness direction of the Ag underlayer 30, the better, but extremely reducing the electrical resistance value P leads to an increase in cost. Therefore, the electrical resistance value P in the thickness direction of the Ag underlayer 30 may be 0.4 mΩ or greater.

Figure 6:
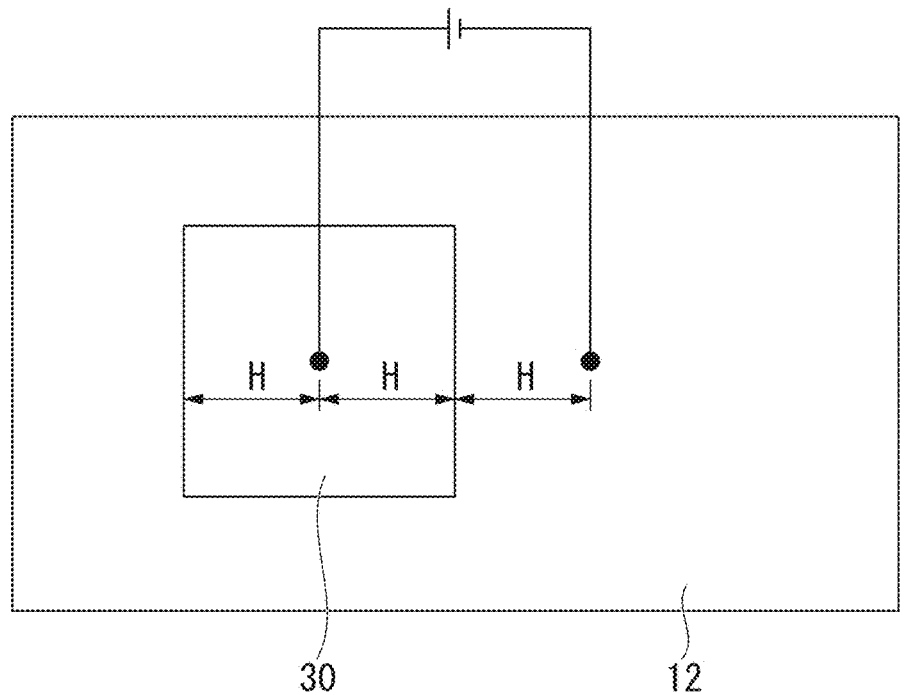
FIG. 6 is a top illustration illustrating a method of measuring an electrical resistance value in a thickness direction of the Ag underlayer.
Figure 7:
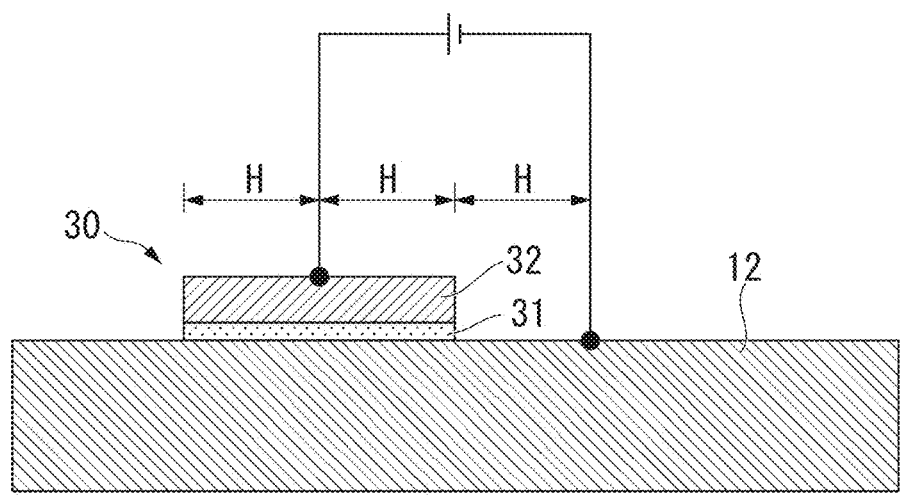
FIG. 7 is a side illustration illustrating the method of measuring an electrical resistance value in a thickness direction of the Ag underlayer.

Here, in this embodiment, an electrical resistance value in a thickness direction of the Ag underlayer 30 is an electrical resistance value between the upper surface of the Ag underlayer 30 and the upper surface of the circuit layer 12. The reason for this is that the electrical resistance of 4N aluminum constituting the circuit layer 12 is extremely smaller than that in the thickness direction of the Ag underlayer 30. In the measurement of the electrical resistance, as illustrated in FIGS. 6 and 7, electrical resistance between a central point on the upper surface of the Ag underlayer 30 and a point on the circuit layer 12 separated from an end of the Ag underlayer 30 by a distance that is the same as a distance from the central point on the upper surface of the Ag underlayer 30 to the end of the Ag underlayer 30 is measured.

In the power module 1 of this embodiment, the bonding layer 2 is provided between the semiconductor element 3 and the Ag underlayer 30. Examples of the bonding layer 2 include a solder layer. Examples of the material constituting the solder layer include Sn—Ag-based materials, Sn—In-based materials, and Sn—Ag—Cu-based materials.

The heat sink 41 is provided to cool the above-described power module substrate 10 with a Ag underlayer and is provided with a flow channel 42 for allowing a cooling medium (for example, cooling water) to flow. In this embodiment, the heat sink 41 is a multiple hole pipe made of aluminum or an aluminum alloy. In this embodiment, the metal layer 13 and the heat sink 41 are bonded to each other via, for example, a brazing material such as Al—Si.

Next, the glass-containing Ag paste that can be used for forming the Ag underlayer 30 will be described.

This glass-containing Ag paste contains a Ag powder, a glass powder, a resin, a solvent, and a dispersing agent. The content of the powder components composed of the Ag powder and the glass powder is 60 mass % to 90 mass % of the entire glass-containing Ag paste, and the remainder is composed of the resin, the solvent, and the dispersing agent.

In this embodiment, the content of the powder components composed of the Ag powder and the glass powder is 85 mass % of the entire glass-containing Ag paste.

The viscosity of the glass-containing Ag paste is adjusted to preferably 10 Pa·s to 500 Pa·s, and more preferably 50 Pa·s to 300 Pa·s.

The Ag powder has a particle diameter of 0.05 μm to 1.0 μm, and in this embodiment, a Ag powder having an average particle diameter of 0.8 μm was used.

The glass powder contains, for example, any one or two or more of a lead oxide, a zinc oxide, a silicon oxide, a boron oxide, a phosphorus oxide, and a bismuth oxide, and its softening temperature is 600° C. or lower. In this embodiment, a glass powder including a lead oxide, a zinc oxide, and a boron oxide and having an average particle diameter of 0.5 μm was used.

A weight ratio A/G of a weight A of the Ag powder to a weight G of the glass powder is adjusted in a range of 80/20 to 99/1, and in this embodiment, A/G was 80/5.

A solvent having a boiling point of 200° C. or higher is suitable, and in this embodiment, diethylene glycol dibutyl ether is used.

The resin adjusts the viscosity of the glass-containing Ag paste, and a resin that is decomposed at 500° C. or higher is suitable. In this embodiment, ethyl cellulose is used.

In this embodiment, a dicarboxylic acid-based dispersing agent is added. The glass-containing Ag paste may be configured without the addition of the dispersing agent.

To produce this glass-containing Ag paste, a mixed powder obtained by mixing a Ag powder with a glass powder and an organic mixture obtained by mixing a solvent with a resin are premixed with each other together with a dispersing agent by a mixer, the obtained premixture is mixed while being kneaded by a roll mill, and then the obtained, kneaded material is subjected to filtering by a paste filter.

Figure 4:
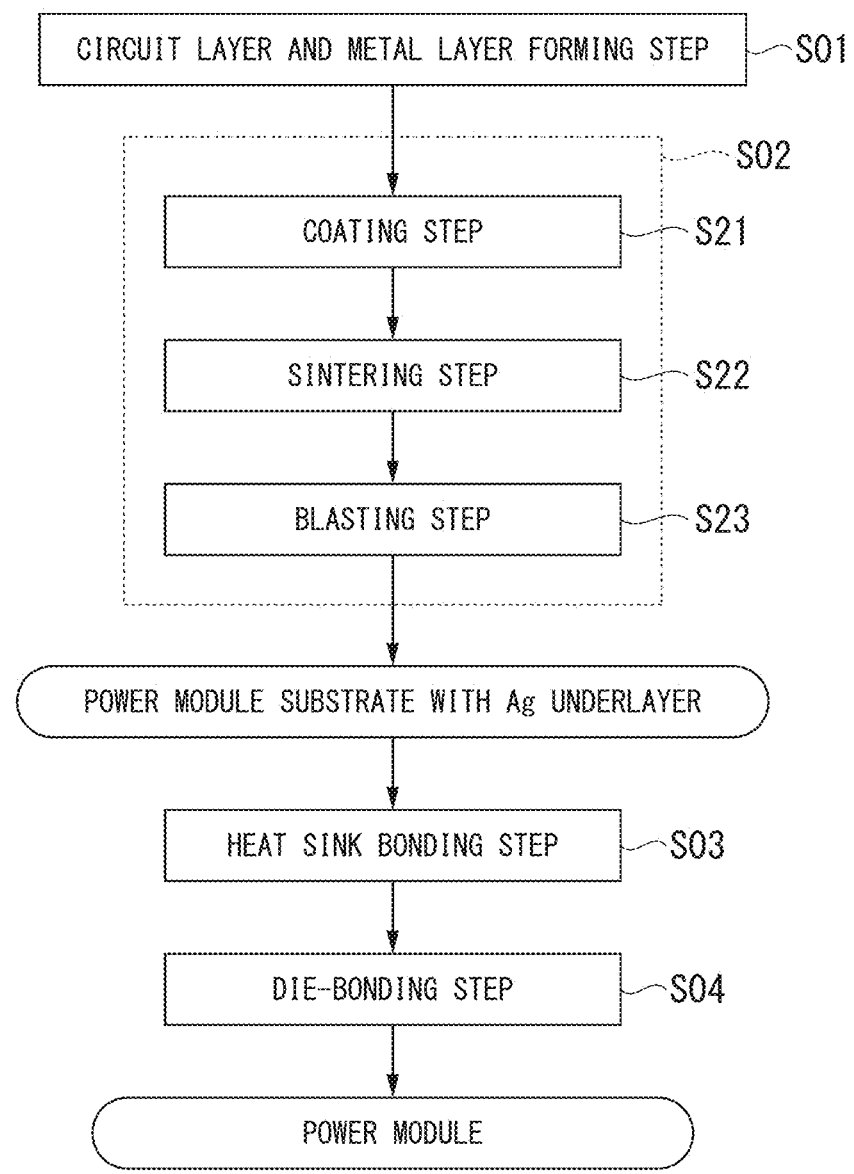
FIG. 4 is a flowchart illustrating an example of a method of manufacturing a power module substrate with a Ag underlayer.

Next, an example of a method of manufacturing the power module substrate 10 with a Ag underlayer of the invention will be described with reference to FIGS. 4 and 5.

First, a metal plate 22 that will serve as a circuit layer 12 and a metal plate 23 that will serve as a metal layer 13 are prepared, and these metal plates 22 and 23 are respectively laminated on one surface and the other surface of a ceramic substrate 11 via a brazing material 26 and cooled after pressurization and heating to bond the metal plates 22 and 23 to a ceramic substrate 11 (circuit layer and metal layer forming step S01).

In this circuit layer and metal layer forming step S01, Si brazing material foil with 7.5 mass % of Al was used as the brazing material 26, and the brazing temperature was set to 640° C. to 650° C.

Next, a Ag underlayer 30 is formed on one surface of the circuit layer 12 (Ag underlayer forming step S02).

In this Ag underlayer forming step S02, first, one surface of the circuit layer 12 is coated with a glass-containing Ag paste (coating step S21). In coating with the glass-containing Ag paste, various means such as a screen printing method, an offset printing method, and a photosensitive can be employed. In this embodiment, the glass-containing Ag paste was formed in a pattern shape by a screen printing method.

In a state in which one surface of the circuit layer 12 is coated with the glass-containing Ag paste, the glass-containing Ag paste is sintered after insertion in a heating furnace (sintering step S22). At this time, the sintering temperature is set to, for example, 350° C. to 645° C.

Through this sintering step S22, the Ag underlayer 30 provided with the glass layer 31 and the Ag layer 32 is formed. At this time, an aluminum oxide film 12A naturally formed on the surface of the circuit layer 12 is melted and removed by the glass layer 31, and the glass layer 31 is directly formed on the circuit layer 12. In addition, in the glass layer 31, fine conductive particles 33 of approximately several nanometers in particle diameter are dispersed. The conductive particles 33 are crystalline particles containing at least one of Ag or Al, and are assumed to be precipitated in the glass layer 31 during sintering.

Next, a conductive property improving treatment, for example, blasting is performed on a surface of the Ag underlayer 30 (Ag layer 32) on a side opposite to the circuit layer 12 to form a blast surface 30A (blasting step S23).

In this blasting step S23, as blast particles, glass particles such as silica having new Mohs hardness of 2 to 7, ceramic particles, metal particles, resin beads, or the like can be used. In this embodiment, glass particles are used. In addition, the particle diameter of the blast particles is in a range of 20 μm to 150 μm.

The blast pressure is in a range of 0.05 MPa to 0.8 MPa, and the treatment time is in a range of 1 second to 10 seconds.

In a case where the Ag underlayer 30 is subjected to blasting (conductive property improving treatment) as described above, when a maximum value of intensity in a wavenumber range of 3,000 $cm^{-1}$ to 4,000 $cm^{-1}$ in a Raman spectrum obtained by a Raman spectroscopy with incident light (light source light) made incident from the surface 30A of the Ag layer 32 on a side opposite to the glass layer 31 using a Raman spectroscopic measuring apparatus is indicated by $I_A$, and a maximum value of intensity in a wavenumber range of 450 $cm^{-1}$ to 550 $cm^{-1}$ is indicated by $I_B$, a Ag underlayer 30 in which $I_A/I_B$ is 1.1 or greater and conductive properties are improved due to ionization of Ag is formed.

In this manner, the power module substrate 10 with a Ag underlayer of this embodiment is manufactured.

Next, a heat sink 41 is laminated on the other surface of the metal layer 13 via a brazing material, and cooling is performed after pressurization and heating to bond the heat sink 41 to the metal layer 13 (heat sink bonding step S03).

In this heat sink bonding step S03, Si brazing material foil with 10 mass % of Al was used as the brazing material, and the brazing temperature was set to 590° C. to 610° C.

A semiconductor element 3 such as a power semiconductor element such as an IGBT or a light-emitting element such as a LED is mounted on the blast surface 30A of the Ag underlayer 30 via a solder material, and is solder-bonded in a reduction furnace (die-bonding step S04).

At this time, in a bonding layer 2 formed by the solder material, a part or the whole of the Ag layer 32 constituting the Ag underlayer 30 is melted.

Accordingly, a power module 1 in which the semiconductor element 3 is bonded on the circuit layer 12 via the bonding layer 2 is produced.

According to the power module 1 and the power module substrate 10 with a Ag underlayer of this embodiment configured as described above, since the Ag underlayer 30 formed of the glass layer 31 and the Ag layer 32 formed by lamination on the glass layer 31 is formed on one surface of the circuit layer 12, and a conductive property improving treatment such as blasting is performed on a surface of the Ag underlayer 30 on a side opposite to the circuit layer 12 to form the blast surface 30A, Ag ionization is promoted and Ag changes into $Ag^+$, whereby the conductive properties of the Ag underlayer 30 are improved. The Ag underlayer 30 subjected to the conductive property improving treatment has a characteristic in which $I_A/I_B$ is 1.1 or greater when a maximum value of intensity in a wavenumber range of 3,000 $cm^{-1}$ to 4,000 $cm^{-1}$ in a Raman spectrum obtained by a Raman spectroscopy with incident light (light source light) made incident from the surface 30A of the Ag layer 32 on a side opposite to the glass layer 31 is indicated by $I_A$, and a maximum value of intensity in a wavenumber range of 450 $cm^{-1}$ to 550 $cm^{-1}$ is indicated by $I_B$.

In addition, in the blasting step S23 in which the blast surface 30A is formed, a pressure can be applied to the Ag layer 32 and pores in the Ag layer 32 are crushed. Furthermore, a part that is brought into direct contact with the circuit layer 12 is formed in a part of the Ag layer 32, and the electrical resistance value of the Ag underlayer 30 can be significantly reduced.

Here, in this embodiment, in the blasting step S23, glass particles having new Mohs hardness of 2 to 7 are used as blast abrasive particles, and thus a pressure can be securely applied to the Ag layer 32 without removal of the Ag layer 32 by blasting, and the electrical resistance value of the Ag underlayer 30 can be significantly reduced.

In addition, since the electrical resistance value in the thickness direction of the Ag underlayer 30 is 10 mΩ or less, the conductive properties of the Ag underlayer 30 are secured, and by bonding the semiconductor element 3 to the Ag underlayer 30 via the bonding layer 2, it is possible to obtain a power module 1 of which the conduction loss is small.

The embodiments of the invention have been described as above, but the invention is not limited thereto, and can be appropriately modified without departing from the technical ideas of the invention.

For example, in this embodiment, as the conductive property improving treatment, blasting is performed on the surface 30A of the Ag layer 32 on a side opposite to the glass layer 31. However, a treatment other than the blasting may be performed as long as it is a treatment of improving the conductive properties by promoting ionization of Ag of the Ag underlayer 30, and the conductive property improving treatment is not limited to a specific treatment method.

In addition, in this embodiment, a description has been given in which the metal plates constituting the circuit layer and the metal layer are rolled plates of pure aluminum (4N aluminum) with a purity of 99.99 mass %, but the invention is not limited thereto. The metal plates may be made of another aluminum or an aluminum alloy. The metal plates constituting the circuit layer and the metal layer may be made of copper or a copper alloy. A structure obtained by solid phase diffusion bonding of a copper plate to an aluminum plate may also be used.

In addition, a description has been given in which the aluminum plate and the ceramic substrate are bonded to each other by brazing, but the invention is not limited thereto. Transient liquid phase bonding, casting, or the like may be applied.

Furthermore, in a case where the metal plates constituting the circuit layer and the metal layer are made of copper or a copper alloy, direct bonding (DBC method), active metal brazing, casting, or the like can be applied when a metal plate made of copper or a copper alloy is bonded to a ceramic substrate.

In addition, a description has been given in which a ceramic substrate made of AlN is used as the insulating layer, but the invention is not limited thereto. A ceramic substrate made of $Si_3N_4$, $Al_2O_3$, or the like may be used, and the insulating layer may be made of an insulating resin.

In this embodiment, a description has been given in which a semiconductor element is bonded on the Ag underlayer via a solder material, but the invention is not limited thereto. A semiconductor element may be bonded on the Ag underlayer using a silver oxide paste, a paste containing silver particles, a conductive adhesive containing a Ag powder, or the like. In this case, due to bonding of Ag to Ag, bonding reliability between the semiconductor element and the Ag underlayer can be improved.

As the silver oxide paste, a material containing a silver oxide powder, a reducing agent, a resin, a solvent, and an organic metal compound powder can be used. It is preferable that the content of the silver oxide powder be 60 mass % to 80 mass % of the entire silver oxide paste, the content of the reducing agent be 5 mass % to 15 mass % of the entire silver oxide paste, the content of the organic metal compound powder be 0 mass % to 10 mass % of the entire silver oxide paste, and the remainder be composed of the solvent. Here, it is preferable that a dispersing agent or a resin be not added in order to suppress remaining of unreacted organic matter after sintering in the silver oxide paste.

In addition, the heat sink is not limited to the example exemplified in this embodiment, and the structure of the heat sink is not particularly limited.

A buffer layer may be provided between the heat sink and the metal layer. A plate material made of aluminum or an alloy thereof, or a composite material containing aluminum (for example, AlSiC) can be used.

EXAMPLES

Confirmation tests performed to confirm effectiveness of the invention will be described.

A circuit layer was formed by bonding a metal plate to one surface of a ceramic substrate. Here, the ceramic substrate was made of AlN and had a size of 27 mm×17 mm×0.6 mm. The metal plate serving as the circuit layer was made of a material shown in Table 1 and had a size of 25 mm×15 mm×0.3 mm.

In a case where the metal plate was an aluminum plate, an Al—Si-based brazing material was used as a bonding material. In a case where the metal plate was a copper plate, an active metal brazing material (Ag—Cu—Ti brazing material) was used as a bonding material.

A Ag underlayer was formed by applying and heating the glass-containing Ag paste described in the embodiment on a surface of the circuit layer.

A non-lead glass powder containing 90.6 mass % of $Bi_2O_3$, 2.6 mass % of ZnO, and 6.8 mass % of $B_2O_3$ was used as a glass powder of the glass-containing Ag paste. Ethyl cellulose was used as the resin, and diethylene glycol dibutyl ether was used as the solvent. A dicarboxylic acid-based dispersing agent was further added.

Here, a weight ratio A/G of a weight A of the Ag powder to a weight G of the glass powder in the glass-containing Ag paste and an amount were adjusted to adjust thickness of the glass layer and the Ag layer as shown in Table 1.

As a conductive property improving treatment, blasting was performed on the sintered Ag underlayer under the conditions shown in Table 1 to form a blast surface. The results of the observation of the formed blast surface are shown in FIG. 8. Here, FIG. 8(a) shows the Ag underlayer before blasting, FIG. 8(b) shows the Ag underlayer subjected to blasting under the conditions of Example 7, and FIG. 8(c) shows the Ag underlayer subjected to blasting under the conditions of Example 1.

In Comparative Examples 1 to 3, blasting was not performed.

Regarding the obtained power module substrates with a Ag underlayer of Examples 1 to 12 and Comparative Examples 1 to 3, an electrical resistance value in a thickness direction of the Ag underlayer was measured using a tester (manufactured by KEITHLEY INSTRUMENTS, INC.: 2010 MULTIMETER) by the method described in FIGS. 6 and 7. The electrical resistance was measured between a central point on the upper surface of the Ag underlayer and a point on the circuit layer separated from an end of the Ag underlayer by a distance H from the central point on the upper surface of the Ag underlayer to the end of the Ag underlayer.

Surface roughness Ra of the surface (blast surface) of the Ag underlayer after the blasting was measured. The measurement was performed on three fields of view using a laser microscope VK-X200 (manufactured by KEYENCE CORPORATION., software VK-Analyzer attached to the device) at an object lens magnification of 20 times, and an average of the obtained values was defined as the surface roughness Ra. In Comparative Examples 1 to 3 in which blasting was not performed, the measurement of the surface roughness Ra was not performed.

In addition, using a microlaser Raman spectroscopic analysis apparatus (manufactured by HORIBA, Ltd.: Model No. XploRA), the Raman spectrums of the Ag underlayers of Examples 1 to 12 and Comparative Examples 1 to 3 were measured with an incident light (light source light) wavelength of 532 nm. From a maximum value ($I_A$) of the intensity in a wavenumber range of 3,000 $cm^{-1}$ to 4,000 $cm^{-1}$ of the obtained Raman spectrum and a maximum value ($I_B$) of the intensity in a wavenumber range of 450 $cm^{-1}$ to 550 $cm^{-1}$, $I_A/I_B$ was calculated. The measurement place was an area of the glass on the Ag underlayer, and the number of times of integration was 3.

The above evaluation results are shown in Table 1.

TABLE 1

|  | Circuit Layer | Ag Underlayer | | Blasting | | | | Surface Roughness | | |
|---|---|---|---|---|---|---|---|---|---|---|
|  |  | Glass Layer (μm) | Ag Layer (μm) | Blast Abrasive Particles | | | | Ra After Blasting (μm) | Electrical Resistance (mΩ) | $I_A/I_B$ |
|  |  |  |  | Mohs hardness | Particle Diameter (μm) | Pressure (MPa) | Time (sec) |  |  |  |
| Example 1 | 4N aluminum | 0.1 | 7 | 6.5 | 45 | 0.4 | 4 | 0.7 | 0.5 | 1.7 |
| Example 2 | 4N aluminum | 0.1 | 7 | 7 | 45 | 0.4 | 4 | 1.3 | 0.5 | 1.8 |
| Example 3 | 4N aluminum | 0.1 | 7 | 2 | 45 | 0.4 | 4 | 0.5 | 4.5 | 1.2 |
| Example 4 | 4N aluminum | 0.1 | 7 | 6.5 | 20 | 0.4 | 4 | 0.6 | 1.1 | 1.4 |
| Example 5 | 4N aluminum | 0.1 | 7 | 6.5 | 150 | 0.4 | 4 | 1.4 | 0.4 | 1.9 |
| Example 6 | 4N aluminum | 0.1 | 7 | 6.5 | 45 | 0.75 | 4 | 1.2 | 0.4 | 1.8 |
| Example 7 | 4N aluminum | 0.1 | 7 | 6.5 | 45 | 0.1 | 4 | 0.5 | 0.8 | 1.5 |
| Example 8 | 4N aluminum | 0.1 | 7 | 6.5 | 45 | 0.4 | 2 | 0.6 | 2.2 | 1.3 |
| Example 9 | 4N aluminum | 0.1 | 7 | 6.5 | 45 | 0.4 | 9 | 1.1 | 0.5 | 1.6 |
| Example 10 | 4N aluminum | 0.2 | 15 | 6.5 | 45 | 0.4 | 4 | 0.7 | 1.1 | 1.4 |
| Example 11 | Oxygen-free copper | 0.1 | 7 | 6.5 | 45 | 0.4 | 4 | 0.7 | 0.9 | 1.5 |
| Example 12 | 4N aluminum | 0.1 | 7 | 2 | 45 | 0.4 | 2 | 0.35 | 9.8 | 1.1 |
| Comparative Example 1 | 4N aluminum | 0.1 | 7 | No Blasting | | | | — | 80 | 0.5 |
| Comparative Example 2 | 4N aluminum | 0.2 | 15 | No Blasting | | | | — | 125 | 0.6 |
| Comparative Example 3 | Oxygen-free copper | 0.1 | 7 | No Blasting | | | | — | 95 | 0.5 |

*4N Aluminum: Aluminum with a purity of at least 99.99 mass %
*$I_A$: A maximum value of intensity in a wavenumber range of 3,000 cm$^{-1}$ to 4,000 cm$^{-1}$ in a Raman spectrum
*$I_B$: A maximum value of intensity in a wavenumber range of 450 cm$^{-1}$ to 550 cm$^{-1}$ in a Raman spectrum In Examples 1 to 12 in which the blast surface was formed by performing blasting on the Ag underlayer, the electrical resistance value was lower than in Comparative Examples 1 to 3 in which the glass layer and the Ag layer had the same thickness.

In Examples 1 to 12, when a maximum value of intensity in a wavenumber range of 3,000 cm$^{-1}$ to 4,000 cm$^{-1}$ in a Raman spectrum was indicated by $I_A$, and a maximum value of intensity in a wavenumber range of 450 cm$^{-1}$ to 550 cm$^{-1}$ was indicated by $I_B$, $I_A/I_B$ was 1.1 or greater. In Comparative Examples 1 to 3, $I_A/I_B$ was less than 1.0.

From the above description, it was confirmed that according to the invention, it is possible to provide a power module substrate with a Ag underlayer provided with a Ag underlayer having low electrical resistance.

INDUSTRIAL APPLICABILITY

According to the power module of the invention, the electrical resistance value of the Ag underlayer can be significantly reduced even in a case where the Ag underlayer has the glass layer. Therefore, the power module of the invention is suitable for a power semiconductor element for high-power control that is used to control wind power generation, electric cars, hybrid-power cars, and the like.

REFERENCE SIGNS LIST

1: POWER MODULE
10: POWER MODULE SUBSTRATE WITH Ag UNDERLAYER
11: CERAMIC SUBSTRATE (INSULATING LAYER)
12: CIRCUIT LAYER
30: Ag UNDERLAYER
30A: BLAST SURFACE (SURFACE SUBJECTED TO CONDUCTIVE PROPERTY IMPROVING TREATMENT)
31: GLASS LAYER
32: Ag LAYER

The invention claimed is:
1. A power module substrate with a Ag underlayer comprising:
 a circuit layer that is formed on one surface of an insulating layer; and
 a Ag underlayer that is formed on the circuit layer,
 wherein the Ag underlayer is composed of a glass layer that is formed on the circuit layer side and a Ag layer that is formed by lamination on the glass layer, and regarding the Ag underlayer, in a Raman spectrum obtained by a Raman spectroscopy with incident light made incident from a surface of the Ag layer on a side opposite to the glass layer, when a maximum value of intensity in a wavenumber range of 3,000 $cm^{-1}$ to 4,000 $cm^{-1}$ is indicated by $I_A$, and a maximum value of intensity in a wavenumber range of 450 $cm^{-1}$ to 550 $cm^{-1}$ is indicated by $I_B$, $I_A/I_B$ is 1.1 or greater.

2. The power module substrate with a Ag underlayer according to claim 1,
wherein an electrical resistance value in a thickness direction of the Ag underlayer is 10 mΩ or less.

3. The power module substrate with a Ag underlayer according to claim 1,
wherein the Ag underlayer is a sintered body of a glass-containing Ag paste.

4. The power module substrate with a Ag underlayer according to claim 1,
wherein the surface of the Ag underlayer on a side opposite to the glass layer is a surface subjected to a conductive property improving treatment.

5. A power module comprising:
the power module substrate with a Ag underlayer according to claim 1; and
a semiconductor element,
wherein the semiconductor element is bonded to the Ag underlayer via a bonding layer.

6. The power module substrate with a Ag underlayer according to claim 2,
wherein the Ag underlayer is a sintered body of a glass-containing Ag paste.

7. The power module substrate with a Ag underlayer according to claim 2,
wherein the surface of the Ag underlayer on a side opposite to the glass layer is a surface subjected to a conductive property improving treatment.

8. The power module substrate with a Ag underlayer according to claim 3,
wherein the surface of the Ag underlayer on a side opposite to the glass layer is a surface subjected to a conductive property improving treatment.

9. The power module substrate with a Ag underlayer according to claim 6,
wherein the surface of the Ag underlayer on a side opposite to the glass layer is a surface subjected to a conductive property improving treatment.

10. A power module comprising:
the power module substrate with a Ag underlayer according to claim 2; and
a semiconductor element,
wherein the semiconductor element is bonded to the Ag underlayer via a bonding layer.

11. A power module comprising:
the power module substrate with a Ag underlayer according to claim 3; and
a semiconductor element,
wherein the semiconductor element is bonded to the Ag underlayer via a bonding layer.

12. A power module comprising:
the power module substrate with a Ag underlayer according to claim 4; and
a semiconductor element,
wherein the semiconductor element is bonded to the Ag underlayer via a bonding layer.

13. A power module comprising:
the power module substrate with a Ag underlayer according to claim 6; and
a semiconductor element,
wherein the semiconductor element is bonded to the Ag underlayer via a bonding layer.

14. A power module comprising:
the power module substrate with a Ag underlayer according to claim 7; and
a semiconductor element,
wherein the semiconductor element is bonded to the Ag underlayer via a bonding layer.

15. A power module comprising:
the power module substrate with a Ag underlayer according to claim 8; and
a semiconductor element,
wherein the semiconductor element is bonded to the Ag underlayer via a bonding layer.

16. A power module comprising:
the power module substrate with a Ag underlayer according to claim 9; and
a semiconductor element,
wherein the semiconductor element is bonded to the Ag underlayer via a bonding layer.

* * * * *